US007510938B2

(12) United States Patent
de Frésart

(10) Patent No.: US 7,510,938 B2
(45) Date of Patent: Mar. 31, 2009

(54) SEMICONDUCTOR SUPERJUNCTION STRUCTURE

(75) Inventor: Edouard D. de Frésart, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 189 days.

(21) Appl. No.: 11/510,030

(22) Filed: Aug. 25, 2006

(65) Prior Publication Data

US 2008/0048175 A1 Feb. 28, 2008

(51) Int. Cl.
*H01L 21/336* (2006.01)

(52) U.S. Cl. ....................... 438/273; 438/268; 438/912; 257/E21.04

(58) Field of Classification Search ................. 438/268, 438/273, 812; 257/E21.04
See application file for complete search history.

(56) References Cited

U.S. PATENT DOCUMENTS 4,754,310 A 6/1988 Coe
5,216,275 A 6/1993 Chen
5,438,215 A 8/1995 Tihanyi
6,097,063 A 8/2000 Fujihira
6,274,904 B1 8/2001 Tihanyi
6,291,856 B1 9/2001 Miyasaka
7,355,224 B2 * 4/2008 Cai ............................ 257/260
7,355,257 B2 * 4/2008 Kishimoto et al. .......... 257/409
7,368,777 B2 * 5/2008 Kocon ........................ 257/302
2002/0027237 A1 3/2002 Onishi
2006/0011962 A1 * 1/2006 Kocon ........................ 257/302
2006/0194392 A1 * 8/2006 Nagaoka ..................... 438/268
2006/0256487 A1 * 11/2006 Kishimoto et al. ............ 361/19

FOREIGN PATENT DOCUMENTS

JP 2003008014 A 1/2003

OTHER PUBLICATIONS

Fujihara, "Theory of Semiconductor Superjunction Devices," Jpn J. Appl. Phys., vol. 36 (1997), pp. 6254-6262.
Fujihara and Miyasaka, "Simulated Superior Performance of Semiconductor Superjunction Devices," Proc. of 1998 Symposium on Power Semiconductor Devices & ICs, Kyoto, Japan, pp. 423-426.

(Continued)

*Primary Examiner*—Ngan Ngo
(74) *Attorney, Agent, or Firm*—Ingrassia, Fisher & Lorenz, P.C.

(57) ABSTRACT

Semiconductor structures and methods are provided for a semiconductor device (54-11, 54-12) employing a superjunction structure (81). The method comprises, forming (52-6) first spaced-apart regions (70-1, 70-2, 70-3, 70-4, etc.) of a first semiconductor material (70) of a first conductivity type, forming (52-9) second spaced-apart regions (74-1, 74-2, 74-3, etc.) of a second semiconductor material (74) of opposite conductivity type interleaved with the first space-apart regions (70-1, 70-2, 70-3, 70-4, etc.) with PN junctions therebetween, thereby forming a superjunction structure, wherein the second regions have higher mobility than the first regions for the same carrier type. Other regions (88) are provided in contact with the superjunction structure (81) to direct control current flow therethrough. In a preferred embodiment, the first material (70) is relaxed SiGe and the second material (74) is strained silicon.

20 Claims, 8 Drawing Sheets

OTHER PUBLICATIONS

Strollo and Napoli, "Optimal ON-Resistance Versus Breakdown Voltage Tradeoff in Superjunction Power Devices. A Novel Analytical Model," IEEE Transactions on Electron Devices, Vo. 48, No. 9, Sep. 2001, pp. 2161-2167.

Deboy, "The Superjunction Principle as Enabling Technology for Advanced Power Solutions", IEEE ISIE 2005, Jun. 20-23, 2005, Dubrovnik, Croatia, pp. 469-472.

Udrea, Florin, Advanced 3D RESURF XDevices for Power integrated Circuit, IEEE, 2002, 229-238.

News Release Digest Hitachi, Ltd., Research and Development Group, Tokyo, Japan, dated Jun. 17, 2005, "Concerning Use of Strained Silicon in Analog Semiconductor Devices".

* cited by examiner

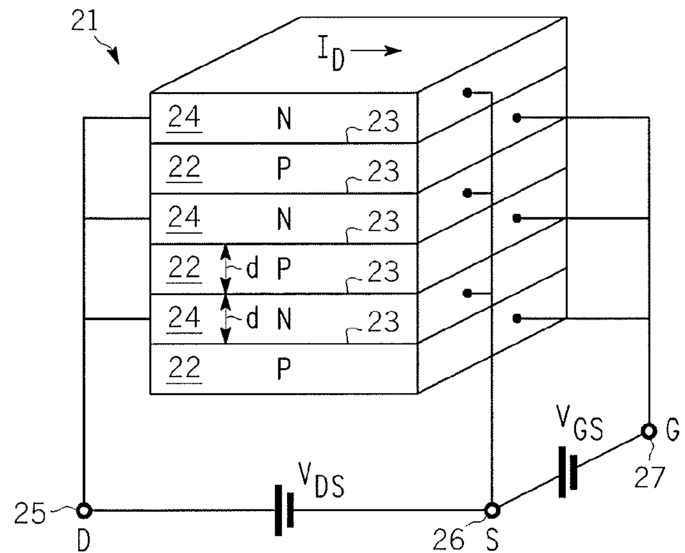
FIG. 1
-PRIOR ART-
FIG. 2
-PRIOR ART-
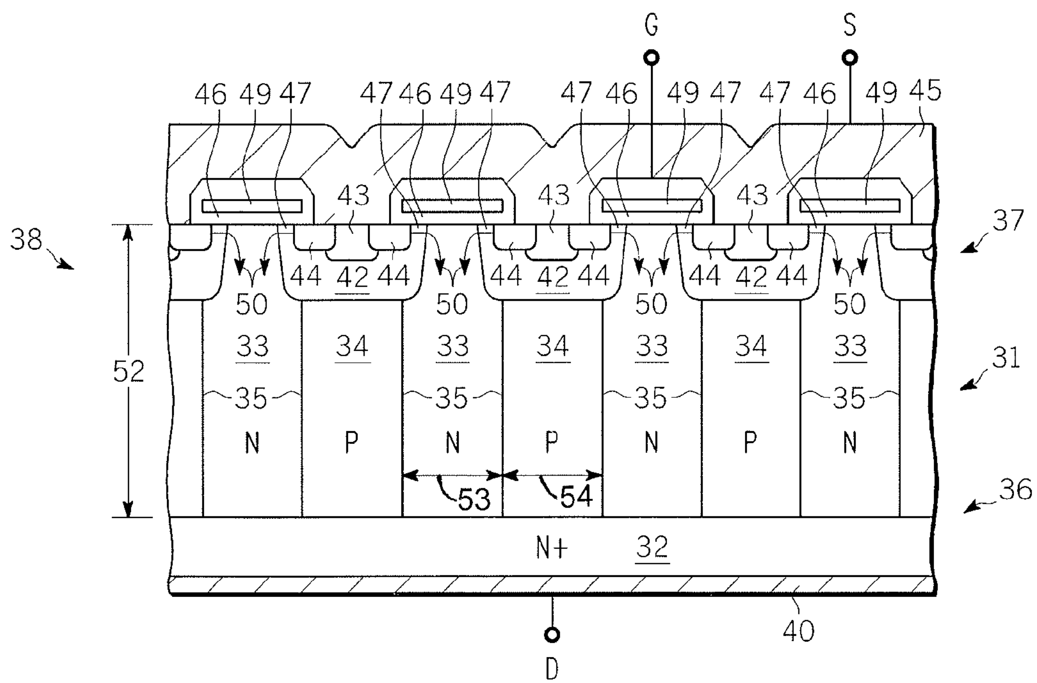

52-6

52-7

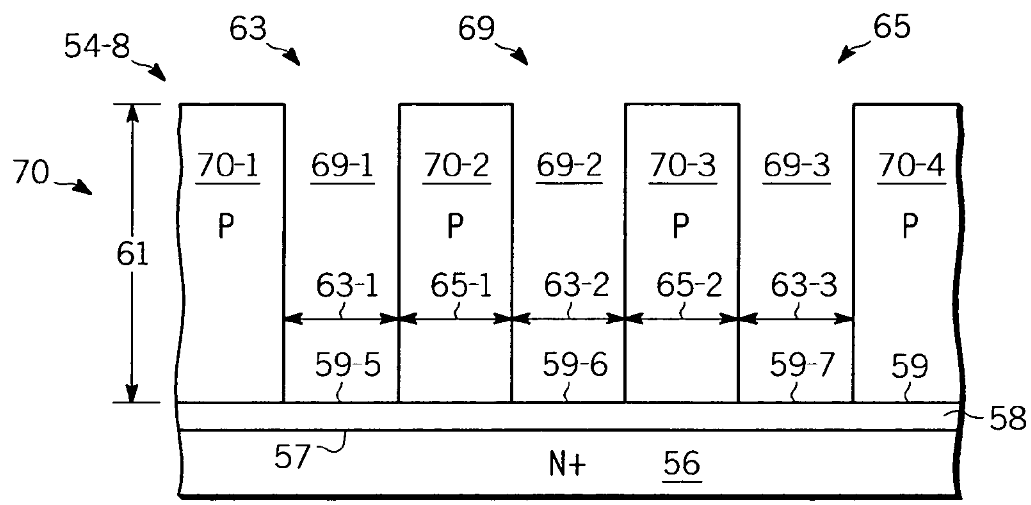
FIG. 8 52-8
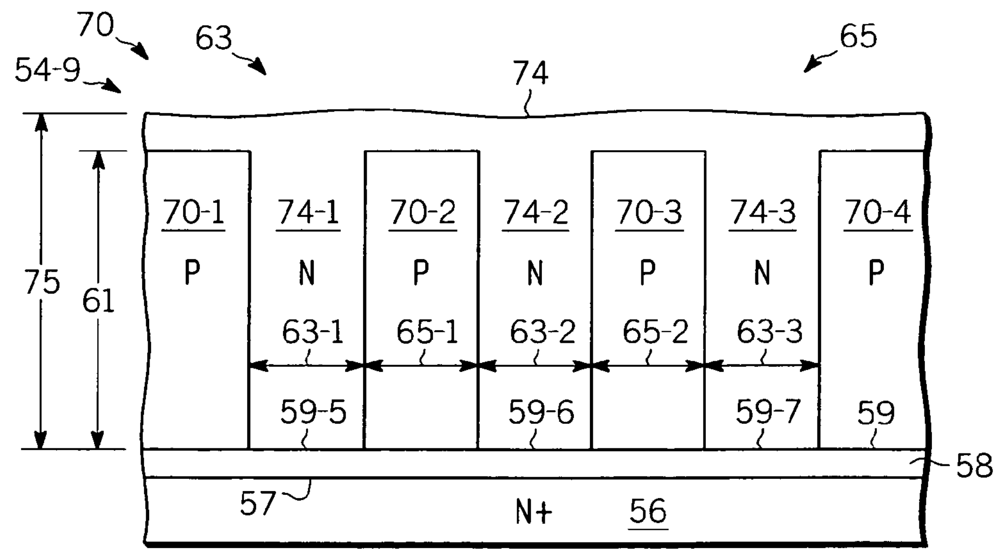
FIG. 9 52-9

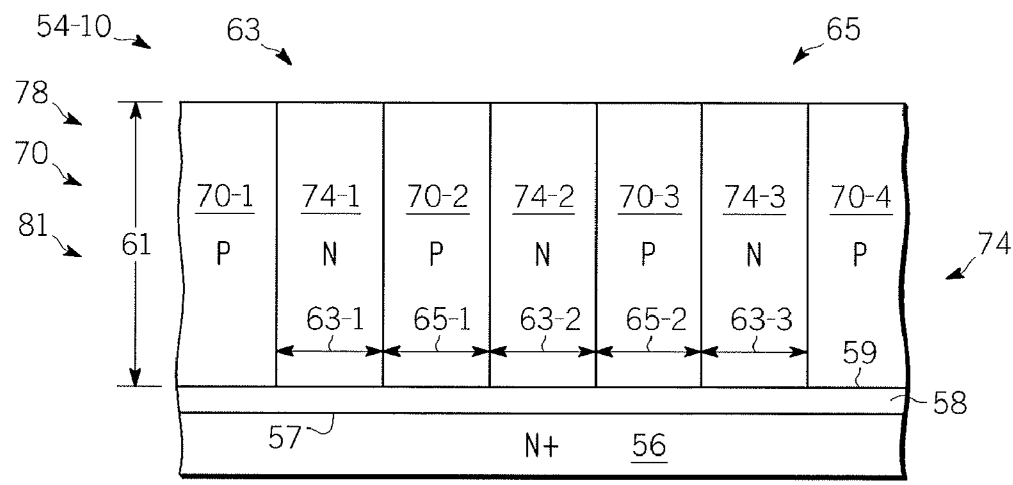
FIG. 10 52-10
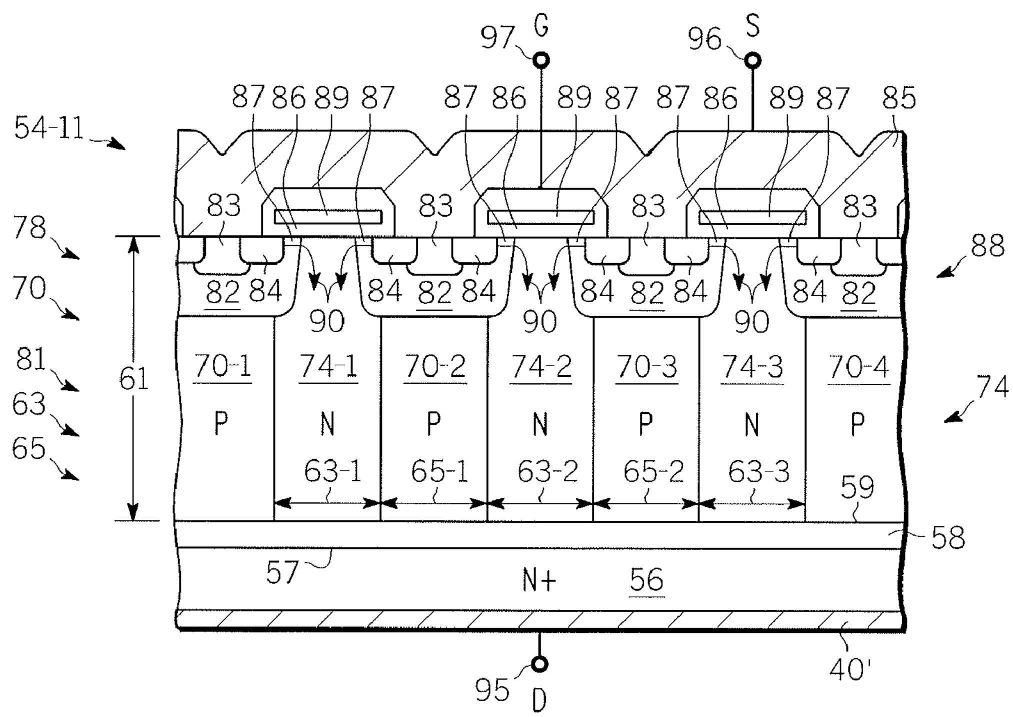
FIG. 11 52-11

SEMICONDUCTOR SUPERJUNCTION STRUCTURE

TECHNICAL FIELD

The present invention generally relates to semiconductor structures, and more particularly relates to semiconductor structures incorporating a superjunction.

BACKGROUND

Superjunction structures are well known in the art and are described, for example, by Fujihira, "Theory of Semiconductor Superjunction Devices," *Jpn J. Appl. Phys., Vol.* 36 (1997), pp. 6254-6262; Fujihira and Miyasaka, "Simulated Superior Performance of Semiconductor Superjunction Devices," *Proc. of* 1998 *Symposium on Power Semiconductor Devices & ICs*, Kyoto, Japan, pp. 423-426; Strollo and Napoli, "Optimal ON-Resistance Versus Breakdown Voltage Tradeoff in Superjunction Power Devices. A Novel Analytical Model," *IEEE Transactions on Electron Devices, Vo.* 48, *No.* 9, September 2001, pp. 2161-2167; and Gerald Deboy, "The Superjunction Principle as Enabling Technology for Advanced Power Solutions", *IEEE ISIE* 2005, Jun. 20-23, 2005, *Dubrovnik, Croatia*, pages 469-472. In its simplest form, superjunction structures employ a number of alternatively arranged P and N doped semiconductor layers or regions, with the condition that the doping of these layers are charge-balanced, or Na*Wa=Nd*Wd, in which Na and Nd are the doping concentrations of the P and N layers, and Wa, Wd, the widths of these same layers. Current flow through such superjunction structures is for the most part parallel to the planes of the P—N junctions. Superjunction structures are often employed in high voltage (and high power) semiconductor (SC) devices in order to obtain comparatively high breakdown voltages while minimizing series ON-resistance. The superjunction structures facilitate this desirable combination of properties. Superjunction devices are also available on the open market, as for example, the CoolMOS™ family of devices produced by Infineon of Villach, Austria.

FIG. 1 illustrates prior art JFET superjunction device 20 comprising interleaved array 21 of P-type layers 22 and N-type layers 24 of thickness d, with intervening PN junctions 23. Layers 22, 24 are of the same semiconductor material, e.g., silicon, but with different doping. In FIG. 1, in response to bias voltage $V_{DS}$, drain-source current $I_D$ flows left-to-right through, for example, N-type layers 24 that are coupled at their left ends to drain contact 25 and at their right ends to source contact 26. P-type layers 22 are coupled to gate electrode 27. When appropriately biased, gate potential $V_{GS}$ applied across PN junctions 23 causes drain-source current $I_D$ to increase or decrease at constant $V_{DS}$ depending upon the amount of gate bias $V_{GS}$. Such operation is conventional.

FIG. 2 illustrates prior art TMOS device 30 employing superjunction structure 31 in the drift space between channel 47 and drain 32. Device 30 comprises N+ substrate (e.g., drain) 32 on which has been formed superjunction structure 31 comprising multiple parallel vertically arranged N-type regions 33 and P-type regions 34, of for example silicon, with intervening PN junctions 35. Lower end 36 of superjunction structure 31 contacts substrate 32, which together with electrical contact 40 forms the drain of TMOS transistor 30. Device regions 37 are formed in upper portion 38 of superjunction structure 31. Device regions 37 include P-type body regions 42, P+ body contact regions 43 and N+ source regions 44 located in body regions 42. Gate dielectric 46 extends between source regions 44 above channel regions 47 located in the P-type body regions 42. Gate electrodes 49 overlie gate dielectric 46. Source and body contact 45 makes electrical contact to body contact regions 43 and sources 44. When device 30 is appropriately biased, current 50 flows between source contact 45 and source regions 44 into N-type drift regions 33 and on to substrate drain 32 and drain contact 40. P regions 34 extend from substrate 32 to body regions 42. N regions 33 form the carrier drift region communicating with drain 32. If width 53 of N region 33 and width 54 of P region 34 are properly chosen along with their respective doping densities, according to principles well known in the art, then the combination forms superjuction structure 31 wherein the source-drain breakdown voltage is increased compared to an otherwise identical device of similar drift region thickness 52, but without the alternating N and P regions. Alternatively, thickness 52 may be made smaller for the same breakdown voltage thereby providing lower ON-resistance, or a combination of such beneficial effects may be elected by favorably adjusting thickness 52 and the doping density of regions 33, 34. This is known in the art.

While the structures illustrated in FIGS. 1-2 are useful, it is desirable to improve their properties. Accordingly, there is a need for improved device structures and methods of fabrication that can provide improved performance. It is desirable to provide superjunction type semiconductor devices that offer, for example, improved carrier mobility while still being able to be fabricated using conventional processing equipment and process chemistry. Further it is desirable to provide an improved device structure and method of fabrication that is useful with a variety of semiconductor materials and useful for forming a wide variety of semiconductor devices in addition to the FET devices shown in FIGS. 1 and 2. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and FIG. 1 is a simplified schematic perspective view of a prior art JFET device employing a conventional superjunction structure;

FIG. 2 is a simplified schematic cross-sectional view through a prior art TMOS device employing a further conventional superjunction structure;

FIGS. 3-11 are simplified schematic cross-sectional views of semiconductor devices employing superjunction structures, according to an embodiment of the present invention, at different stages of manufacture;

DETAILED DESCRIPTION

Figure 3:
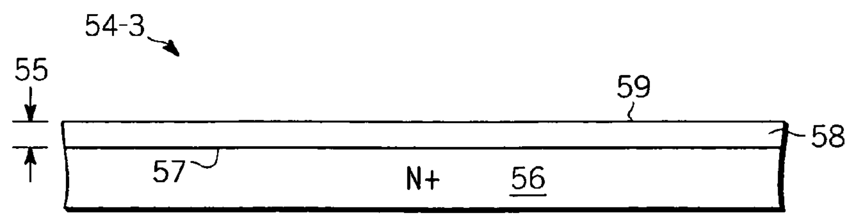
Figure 4:
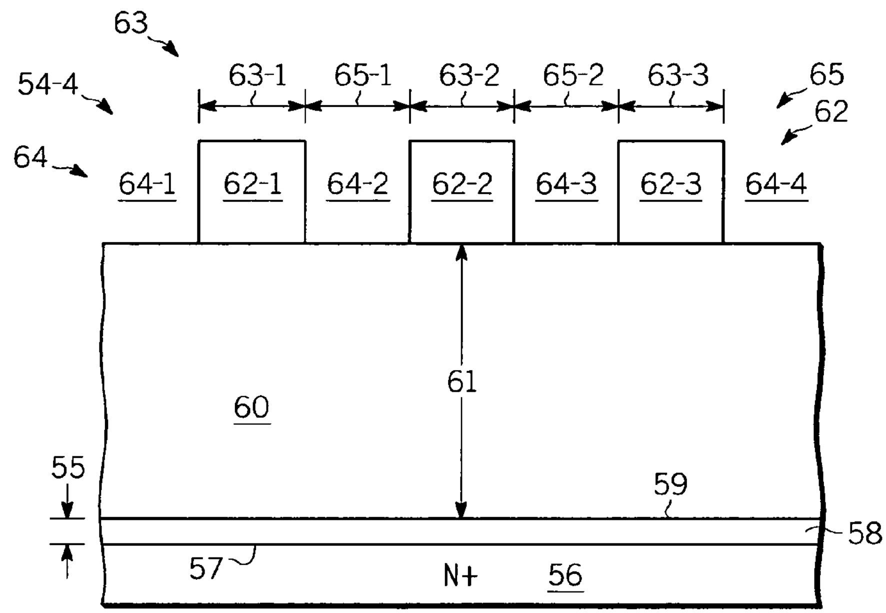

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms “first,” “second,” “third,” “fourth” and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms “comprise,” “include,” “have” and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms “left,” right,” “in,” “out,” “front,” “back,” “up,” “down, “top,” “bottom,” “over,” “under,” “above,” “below” and the like in the description and the claims, if any, are used for describing relative positions and not necessarily for describing permanent positions in space. It is to be understood that the embodiments of the invention described herein may be used, for example, in other orientations than those illustrated or otherwise described herein. The term “coupled,” as used herein, is defined as directly or indirectly connected in an electrical or non-electrical manner.

For convenience of explanation and not intended to be limiting, the present invention is described for superjunction structures formed using Si and Ge as exemplary semiconductor materials, but the present invention is not limited merely to this combination of materials. The principles taught herein apply to a wide variety of semiconductor materials of different lattice constants and/or band gaps that can be combined to produce regions of improved mobility in the active regions of the devices. Non-limiting examples of other suitable semiconductor material combinations are GaN and Si, SiGe and GaAs, GaAs and Ge, Si and $Si_{1-y}C_y$, SiC and AlN, SiC and BP, InGaN and GaN, and various other type IV, III-V and II-VI compounds and mixtures thereof and organic semiconductors. Accordingly, while Si and Ge are identified as a suitable pair of semiconductor materials to obtain the improved properties described herein, the present invention is not limited thereto.

FIGS. 3-11 are simplified schematic cross-sectional views of semiconductor device structures 54-3-54-11 employing superjunctions, according to embodiments of the present invention, at different stages of manufacture 52-3-52-11. Referring now to FIG. 3 and manufacturing stage 52-3, structure 54-3 comprises substrate 56 with upper surface 57 on which is formed buffer layer 58 having upper surface 59. The choice between N or P doping of substrate 56 and buffer layer 58 will depend upon the particular type of device that is being fabricated. By way of example and not intended to be limiting, substrate 56 is conveniently N+ silicon of about 0.05 to 0.5 mm thickness. Buffer layer 58 is conveniently, for example, either N or P-type graded SiGe with thickness 55 of about 1 to 5 micro-meters. The choice between N or P doping of layer 58 will depend upon the particular type of device that is being fabricated. For convenience of explanation, it is assumed in connection with FIGS. 3-11 that layer 58 is of the same doping type as substrate 56, but this is not essential. Chemical vapor deposition (CVD), low pressure chemical vapor deposition (LPCVD), and molecular beam epitaxy (MBE) are well known methods useful for forming layer 58. LPCVD is preferred. The purpose of layer 58 is to provide a transition zone from semiconductor (SC) substrate 56 of a substrate SC material, e.g., silicon, having a first lattice constant to further semiconductor (SC) materials having different lattice constants, that are applied in subsequent steps so as to provide the desired regions of improved mobility. In the case of Si and SiGe mixtures, when substrate 56 is silicon, layer 58 is desirably graded from substantially pure Si at surface 57 (e.g., 100% Si) to a X % Si to Y % Ge mixture at surface 59, where the ratio X:Y at surface 59 is usefully in the range of about 60:40 to 95:05, more conveniently about 70:30 to 90:10 and preferably about 80:20.

In FIG, 4 showing manufacturing stage 52-4, substantially uniform refractory mask layer 60 having thickness 61 is applied on surface 59. Thickness 61 can be used to determine the (vertical) extent of the superjunction structure in the direction of current conduction (see for example, FIGS. 11-12). Thickness 61 in the range of about 2 to 50 micro-meters is useful, all depending on the targeted breakdown voltage. Persons of skill in the art will understand how to choose the thickness range that best suits their particular design targets. Silicon dioxide is a non-limiting example of a suitable material for mask layer 60, but other generally refractory and generally inert materials can also be used. Non-limiting examples, of other useful materials for mask layer 60 are low temperature silicon oxide (LTO), oxide formed by plasma enhanced reaction of tetra-ethyl-ortho-silicate (PETEOS), silicon nitride, combinations thereof, etc. Etch mask 62 of, for example, photo-resist, is applied over layer 60 and patterned to provide protected areas 62-1, 62-2, 62-3 etc., of widths 63-1, 63-2, 63-3, etc., (collectively widths 63) separated by openings 64-1, 64-2, 64-3, 64-4, etc., (collectively openings 64) of widths 65-1, 65-2, etc., (collectively widths 65). Protected areas of etch mask 62 of widths 63 and openings 64 of widths 65 will determine the thicknesses (widths) of the parallel, oppositely-doped layers of the eventual superjunction structure.

Figure 5:
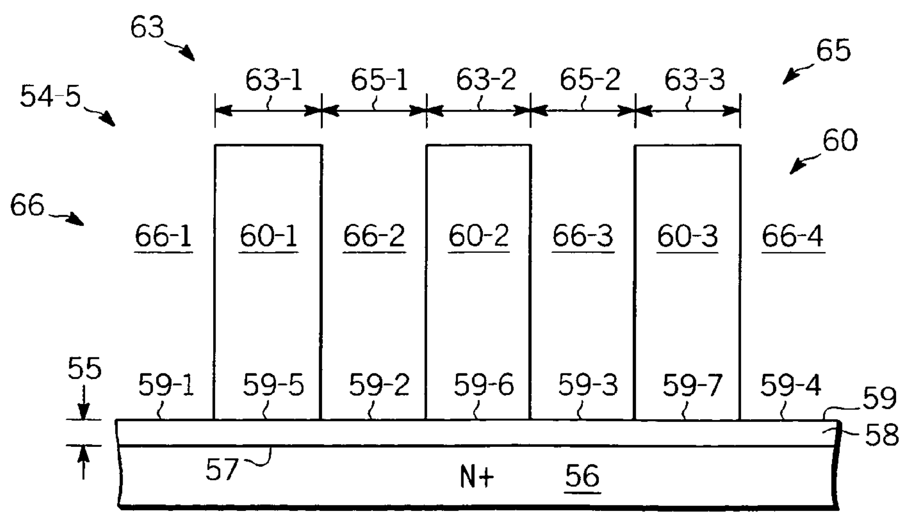

Referring now to FIG. 5 showing manufacturing stage 52-5 and resulting structure 54-5, layer 60 is etched using mask 62 to provide spaced-apart regions 60-1, 60-2, 60-3, etc., corresponding to protected areas 62-1, 62-2, 62-3, etc., separated by spaces 66-1, 66-2, 66-3, 66-4, etc., corresponding to openings 64. Regions 59-1, 59-2, 59-3, 59-4, etc., of surface 59 of transition layer 58 are exposed in spaces (e.g., “trenches”) 66-1, 66-2, 66-3, 66-4, etc, (collectively 66). Regions 59-5, 59-6, 59-7, etc., of surface 59 of transition layer 58 remain covered by portions 60-1, 60-2, 60-3, etc., of layer 60.

Figure 6:
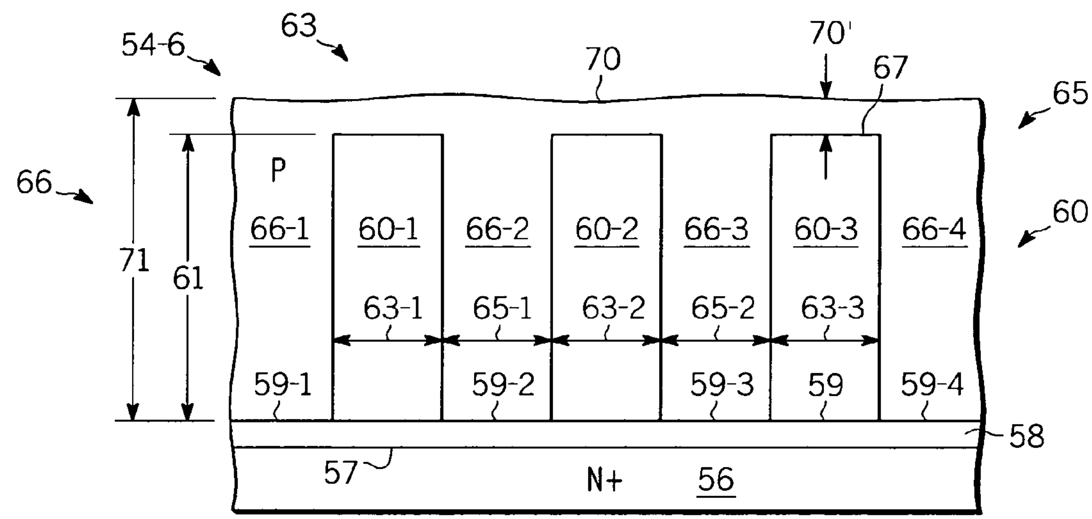

Referring now to FIG. 6 showing manufacturing stage 52-6, first semiconductor material 70 is epitaxially grown or deposited on exposed regions 59-1, 59-2, 59-3, 59-4, etc., of surface 59 of transition layer 58 desirably but not essentially to thickness 71 equal or greater than thickness 61 of layer 60. Chemical vapor deposition (CVD), low pressure chemical vapor deposition (LPCVD), and atmospheric pressure chemical vapor deposition (APCVD), are well known methods useful for forming material 70. LPCVD is preferred. Relaxed SiGe is a non-limiting example of a suitable material for first semiconductor material 70 for use in connection with an N-channel device. Semiconductor material 70 is formed on surface 59 of transition layer 58. In the case of SiGe, material 70 is desirably a mixture of X % Si to Y % Ge, wherein X:Y is usefully in the range of about 60:40 to 95:05, more conveniently about 70:30 to 90:10 and preferably about 80:20, corresponding substantially to the composition mixture at surface 59 of buffer layer 58. Assuming by way of example, that substrate 56 is single crystal silicon with surface 57 having, for example, [100] orientation, then layer 58 is desirably graded in composition from substantially 100% Si at surface 57 to the desired SiGe composition ration of layer 70 at surface 59. This insures that when SiGe material 70 of substantially the same composition is grown on surface regions 59-1, 59-2, 59-3, 59-4, etc., of surface 59, that the resulting SiGe regions 70-1, 70-2, 70-3, 70-4, etc., will be substantially strain free, i.e., "relaxed." It is desirable to dope SC material 70 during deposition according to the desired device functions. In the example presented in FIGS. 6-11, SC material 70 is desirably P-doped to concentrations usefully about 1E15 to 1E19, depending on the targeted breakdown voltage. In manufacturing stage 52-7 of FIG. 7, structure 54-6 of FIG. 6 is planarized so that excess portion 70' if any of region 70 lying above upper surface 67 of mask 60 is removed. Chemical-mechanical polishing (CMP) is a well known suitable technique. Structure 54-7 shown in FIG. 7 results. Persons of skill in the art will understand that it is not essential that thickness 71 exceed thickness 61 of mask layer 60, since even if thickness 71 is less than thickness 61, structure 54-7 may be obtained during planarizing step 52-7 by removing any excess material of mask layer 60.

Figure 7:
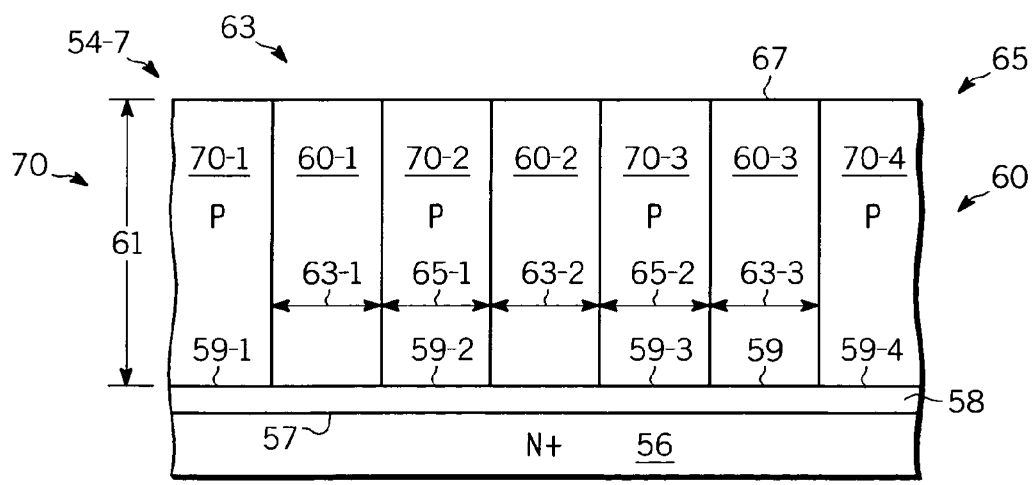

In manufacturing stage 52-8 shown in FIG. 8, structure 54-7 of FIG. 7 is etched to substantially remove remaining portions 60-1, 60-2, 60-3, etc., of mask layer 60, thereby exposing previously protected regions 59-5, 59-6, 59-7, etc., of surface 59 of transition layer 58 in spaces (i.e., trenches) 69-1, 69-2, 69-3, etc., (collectively trenches 69). Selective etching that removes remaining portions of mask 60 without significantly attacking material 70 is preferred. Structure 54-8 with trenches 69 results. In manufacturing stage 52-9 of FIG. 9, second semiconductor (SC) material 74 is deposited in trenches 69, thereby forming SC regions 74-1, 74-2, 74-3, etc., interleaved between SC regions 70-1, 70-2, 70-3, 70-4, etc. Layer 74 is desirably epitaxially grown on exposed regions 59-5, 59-6, 59-7, etc., of surface 59 of transition layer 58 desirably but not essentially to thickness 75 preferably equal or greater than thickness 61 of layer 60. Chemical vapor deposition (CVD), low pressure chemical vapor deposition (LPCVD), and atmospheric pressure chemical vapor deposition (APCVD) are well known methods useful for forming material 74. LPCVD is preferred. In manufacturing stage 52-10 of FIG. 10, structure 54-9 is desirably planarized in generally the same manner as described in connection with FIG. 7. Structure 54-10 results. Persons of skill in the art will understand that it is not essential that thickness 75 exceed thickness 61, since even if thickness 75 is less than thickness 61, structure 54-10 may be obtained during planarizing step 52-10 by removing any excess material of SC regions 70.

Non-relaxed silicon is a non-limiting example of a suitable SC material for second SC material 74 in combination with first (e.g., "relaxed") semiconductor (e.g., SiGe) material 70, but this is not intended to be limiting. What is convenient is that SC material 74 be strained relative to SC material 70, for example as a consequence of having a different lattice constant because of its different composition. Thus SC materials 70 and 74 should be sufficiently different in composition and/or crystal structure so that the regions 74-1, 74-2, 74-3, etc., are strained with respect to regions 70-1, 70-2, 70-3, 70-4, etc. Assuming that material 70 is P-type, then material 74 should be N-type or vice-versa, that is, whatever the doping of first SC material 70, second SC material 74 should be of opposite conductivity type in order to provide improved superjunction structure 81 comprising interleaved regions 70, 74 of FIG. 10, with or without transition layer 58 and substrate 56 of structure 54-10. For convenience of description regions 70-1, 70-2, 70-3, 70-4, etc., are labeled as P-type in FIGS. 6-11 and regions 74-1, 74-2, 74-3, etc., are labeled as N-type, but this is not intended to be limiting, and the illustrated doping types may be interchanged. Further, while the terms "first" SC material and "second" SC material are used herein in connection with materials 70 and 74 respectively, this is merely for purposes of identifying different materials or regions and does not imply that they must be applied in any particular order. Persons of skill in the art will understand based on the teachings herein that materials 70 and 74 and resulting interleaved regions 70-1, 70-2, 70-3, 70-4, etc., and 74-1, 74-2, 74-3, etc., of superjunction structure 81 may be formed in either order. By adjusting the composition of materials 70, 74 relative to surface 59 of transition layer 58, either material may be arranged to be relaxed or strained and either may be P or N type. Similarly, layer 58 may be P or N type or intrinsic, depending upon the type of device desired to be formed.

Stated another way, those portions of superjunction structure 81 that are intended to be the primary current carrying portions of drift spaces (e.g., regions 74-1, 74-2, 74-4, etc.) of devices 54-11, 54-12 should be formed from a material having higher mobility than would be obtained from an otherwise homogeneous superjunction structure (e.g., all the same semiconductor material merely with different doping in the N and P regions). This is conveniently accomplished according to the above-described embodiments by providing strained semiconductor material in the current carrying drift space regions, e.g., regions 74-1, 74-2, 74-4, etc., for an N-channel device, taking advantage of the increase in mobility obtainable with strained semiconductor material. For example, an improvement in electron mobility of a factor of about two can be obtained by using strained Si in N-type regions 74 of superjunction structure 81 of an N-channel MOS device relative to the unstrained SiGe of P-type regions 70 of superjunction structure 81 associated with the N-type MOS device. Stated still another way, embodiments of the present invention provide a semiconductor device including superjunction structure 81 of improved properties by using materials of different composition for the N and P regions of superjunction structure 81 so that the primary current carrying material (either N or P) in the drift space has higher mobility than what would otherwise be obtained using a homogeneous but differentially doped semiconductor material. Strained materials usually exhibit increased mobility for one type of carrier and decreased mobility for the opposite type of carrier depending upon whether they are in tension or compression. As explained in connection with the foregoing examples, the material combinations leading to tension or compression should be arranged so that the mobility increase for electrons occurs in the N-type drift regions of the superjunction structure for N-type devices and the mobility increase for holes occurs in the P type drift regions of the superjunction structure for P-type devices. While use of strained semiconductor to obtain the mobility increase is convenient, such mobility increase can also be obtained by using other higher mobility materials in the primary current carrying drift space of the superjunction structure. Thus, for N-channel devices, the higher mobility material should be used for the N-type regions of the superjunction structure and for P-channel devices, the higher mobility material should be used for the P-type regions of the superjunction structure. Thus, strained or unstrained material may be used provided that the carrier mobility is increased in the superjunction drift space portions where principal current conduction occurs.

FIG. 11 showing manufacturing stage 52-11, illustrates how superjunction structure 81 of structure 54-10 of FIG. 10 can be used to form TMOS superjunction device 54-11 analogous to prior art TMOS device 30 of FIG. 2, but with improved properties obtained by providing strained semiconductor material in carrier drift regions 74-1, 74-2, 74-3, etc. TMOS device 54-11 comprises devices regions 78 analogous to device regions 37, located in upper portions 88 of superjunction structure 81, analogous to upper portions 38 of FIG. 2. P-type body regions 82 (analogous to regions 42) are provided in contact with P-type regions 70-1, 70-2, 70-3, 70-4, etc. P+ body contact regions 83 and N-type source regions 84, analogous to regions 43, 44 respectively, are provided in body regions 82. Gate insulator 86 analogous to gate insulator 46 overlies channel regions 87 (analogous to channel regions 47) and gates 89 (analogous to gates 49) are provided overlying gate insulator 86 and channel regions 87. Sources 84 and source contact 85 are coupled to source terminal 96. Gates 89 are coupled to gate terminal 97. Current 90 (analogous to current 50 of FIG. 2) flows from source regions 84 into drain drift spaces 74-1, 74-2, 74-3, etc., and via transition layer 58, substrate 56 and drain contact 40' to drain terminal 95. Geometrically, the structure of device 54-11 resembles device 30 of FIG. 2, however, it has much improved properties by virtue of the higher carrier mobility provided by strained or other higher mobility SC material 74 of drift regions 74-1, 74-2, 74-3, etc. of superjunction structure 81, without any loss of the field spreading advantages provided by superjunction structure 81 comprising regions 70-1, 70-2, 70-3, 70-4, etc., in parallel interleaved arrangement with regions 74-1, 74-2, 74-3, etc. The higher carrier mobility in carrier drift regions 74-1, 74-2, 74-3, etc., provides lower series resistance (e.g., lower Rdson) for the same operating conditions, thereby decreasing the power dissipation and allowing higher switching speeds. These are significant advantages, especially for high speed, high power devices intended for operation at frequencies exceeding about 1 MHz. In addition, the reduction of Rdson allows for improved power handling capability for equal device area, a further significant advantage. Alternatively, the same power handling capability may be obtained at lower cost by virtue of the reduced device sizes (and therefore more dice per wafer) obtainable for the same power handling capability.

Figure 12:
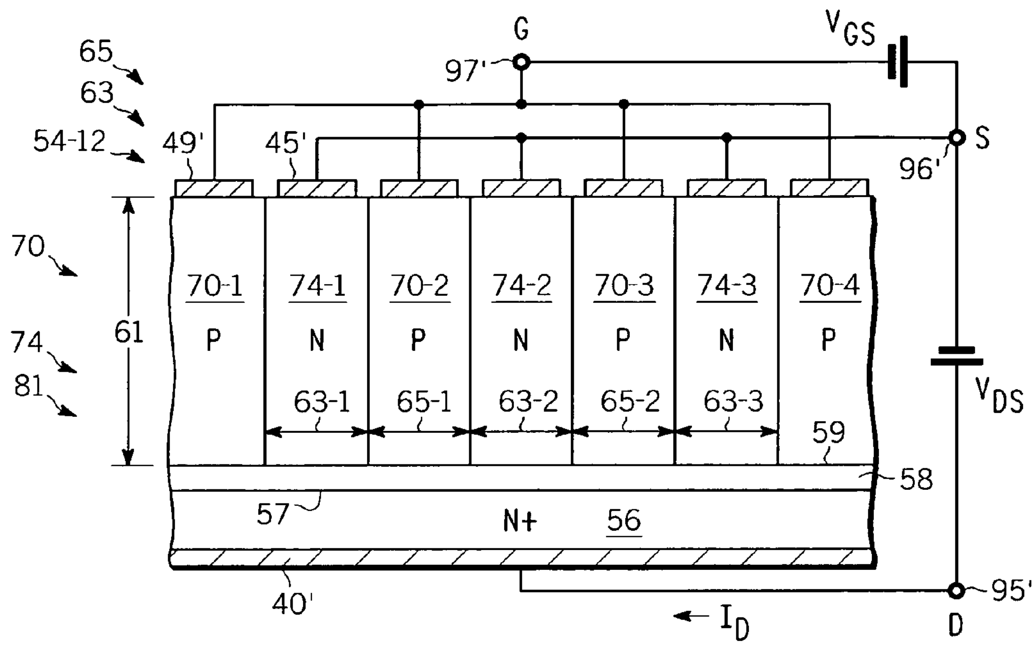
FIG. 12 is a simplified schematic cross-section view of a semiconductor device employing the superjunction structure of FIGS. 3-11, but according to a further embodiment of the present invention.

FIG. 12 is a simplified schematic cross-section view of manufacturing stage 52-12 of JFET semiconductor device 54-12 employing superjunction structure 81, 54-10 of FIG. 3-10 but according to a further embodiment of the present invention. N regions 74 of widths 63 of superjunction structure 81 are coupled to drain terminal 95'via transition layer 58, substrate 56 of structure 54-10 and drain contact 40', and to source terminal 96' via contacts 45'. Source and drain terminals 96', 95' are biased by $V_{DS}$. P regions 70 of widths 65 are coupled to gate terminal 97' via contacts 49'. Control voltage $V_{GS}$ is provided between source terminal 96' and gate terminal 97'. Operation of device 54-12 is analogous to that of device 20 of FIG. 1, but has improved performance because of the higher mobility of regions 74 provided for example, by the use of relaxed and strained materials of P regions 70 and N regions 74 as previously described. In an alternative embodiment, transition layer 58 and substrate 56 may be removed, e.g., by chemical-mechanical polishing, and drain terminal 95' coupled directly to N regions 74 by, for example, appropriate ohmic contacts. Either arrangement is useful. While structures 54-11 and 54-12 illustrate two types of devices where improved superjunction structure 81 of the present invention can be usefully employed to provide superior device properties, this is merely be way of example and not intended to be limiting. Persons of skill in the art will understand based on the teachings herein that improved superjunction structure 81 of the present invention can be beneficially used to implement any of the variety of device types to which ordinary superjunction structures are applicable, and such variations are intended to be included in the claims that follow.

Figure 13:
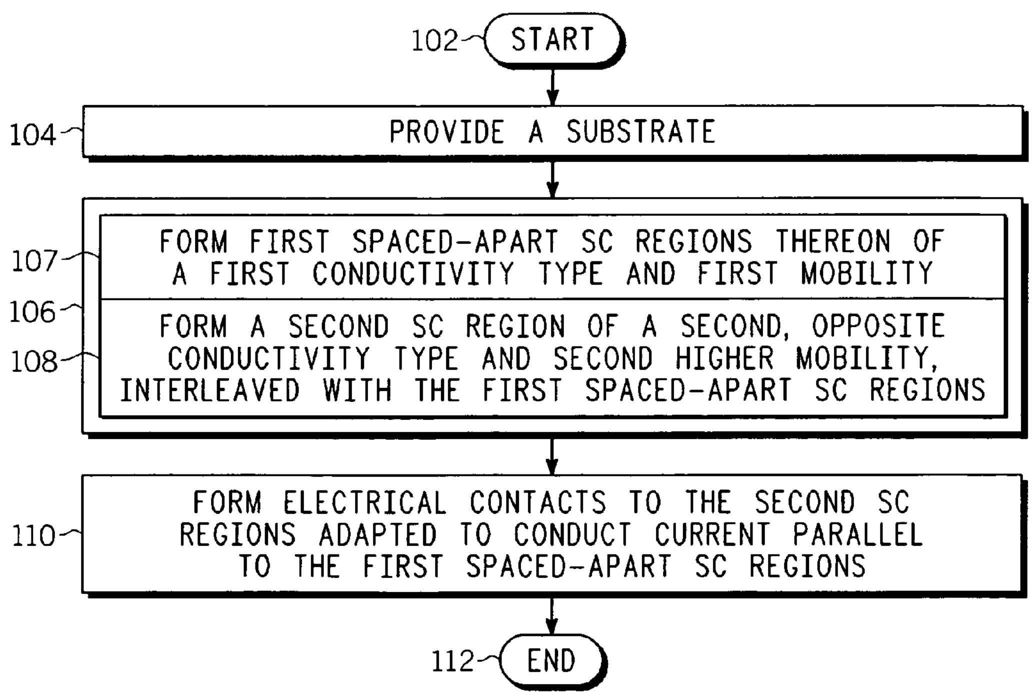
FIGS. 13-15 are simplified flow diagrams illustrating methods for forming the structures illustrated in FIGS. 3-11, according to still further embodiments of the present invention.
Figure 14:
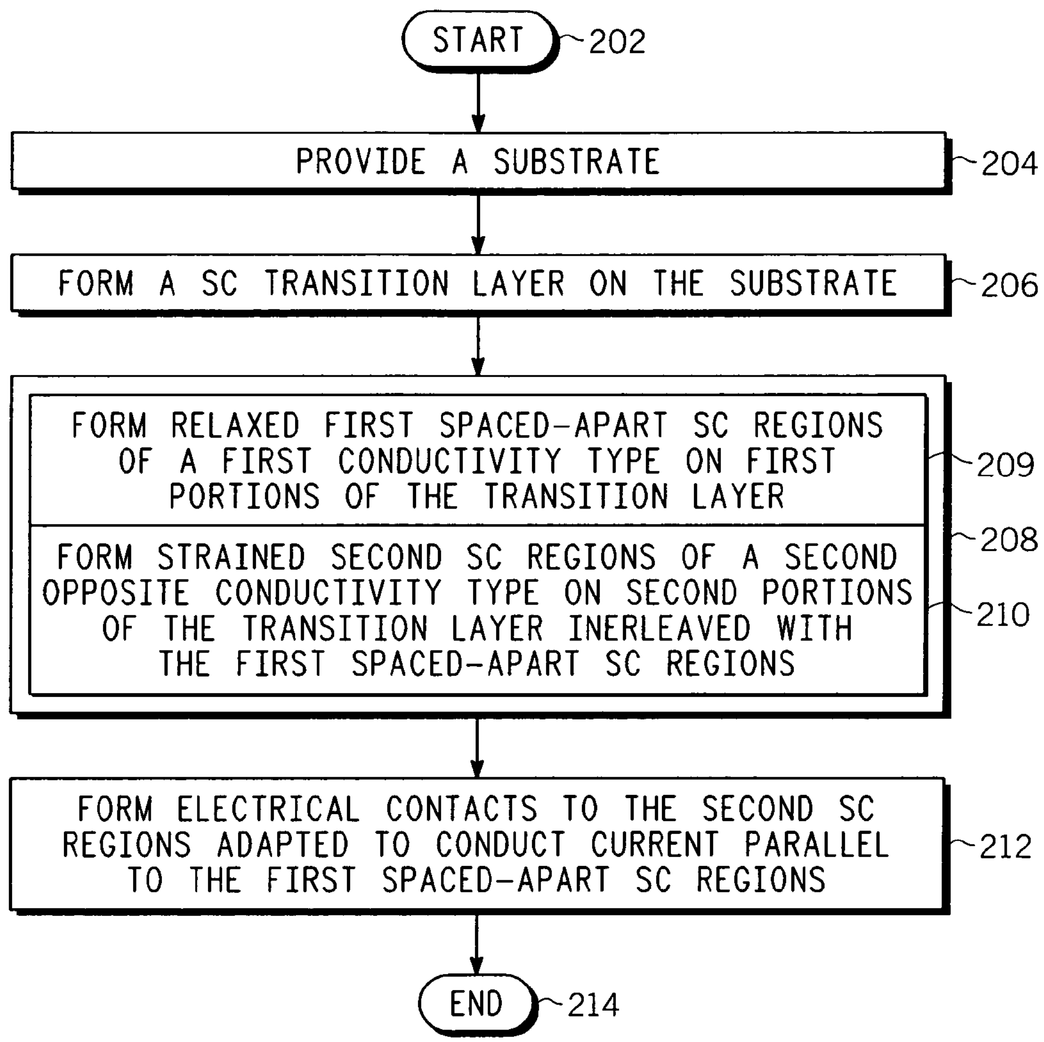
Figure 15:
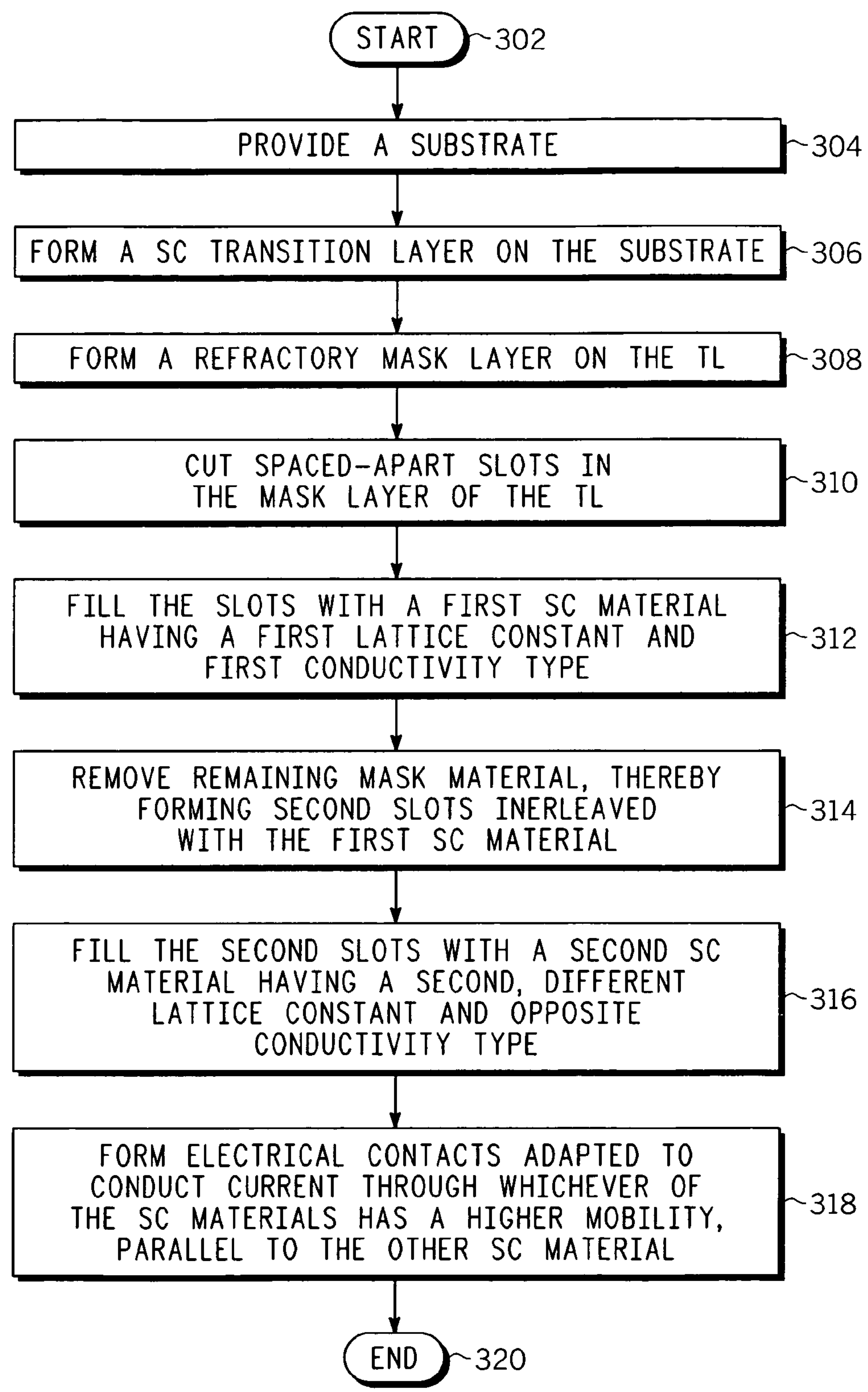

FIGS. 13-15 are simplified flow diagrams illustrating methods 100-300 for forming the structures illustrated in FIGS. 3-12, according to still further embodiments of the present invention, and providing varying levels of detail. Referring now to FIG. 13, method 100 begins with START 102 and initial PROVIDE A SUBSTRATE step 104. Single crystal silicon is a non-limiting example of a suitable substrate material, but other materials can also be used. Non-limiting examples are SiC, Ge, GaAs, GaN, AlN, InN, BP, InP, etc. In another embodiment, step 104 includes providing transition layer 58. In step 106, comprising sub-steps 107, 108 that may be performed in either order, the first and second spaced-apart, interleaved semiconductor regions having, respectively, a first mobility and a larger second mobility are formed, by for example, providing semiconductor regions of relaxed and strained lattice characteristics. In sub-step 107, first spaced-apart (e.g., relaxed) semiconductor (abbreviated as "SC") regions of a first doping type (either N or P) and first mobility are formed on the substrate. In sub-step 108, second spaced-apart (e.g., strained) semiconductor (SC) regions of a second doping type opposite the first doping type and higher mobility are formed interleaved with the first spaced-apart regions. The first and second interleaved SC regions may be formed in either order, that is, the first (e.g., relaxed) SC regions of a first mobility may be formed first and the second (e.g., strained) SC regions of a second higher mobility may be formed second. This is the sequence illustrated in FIGS. 3-10, but this is not essential. Alternatively, the second (e.g., strained) spaced-apart SC regions may be formed first and the first (e.g., relaxed) spaced-apart SC regions may be formed second, interleaved with the second regions. Either arrangement is useful. It will be understood that "first mobility" may be substituted for the word "relaxed" and "second mobility greater than the first mobility" may be substituted for the word "strained" in connection with FIGS. 13-14 and related discussion. This provides superjunction structure 54-10 of FIG. 10. The substrate may be removed, thereby providing superjunction structure 81 alone, i.e., without substrate 56 and transition layer 58. In subsequent step 110, electrical contacts are formed on the second (e.g., strained) SC regions adapted to carry current through the second regions in a direction parallel to the first regions. Additional contacts may also be formed on the first (e.g., relaxed) SC regions. As will be understood by persons of skill in the art based on the teachings herein, the nature and arrangement of the contacts will depend upon the particular type of device or devices being fabricated. Following step 110, method 100 proceeds to END 112, wherein conventional post wafer processing may be employed.

Referring now to FIG. 14, method 200 begins with START 202 and initial PROVIDE A SUBSTRATE step 204, analogous to step 104 of method 100, the details of which are incorporated herein by reference. In step 206, transition layer 58 is formed on substrate 56, as has been previously described. In step 208, comprising sub-steps 209, 210, analogous to sub-steps 107, 108 of method 100, that may be performed in either order, the first and second spaced-apart, interleaved semiconductor (abbreviated as "SC") regions having first and second (larger) mobilities, e.g. relaxed and strained lattice characteristics, are formed on the transition layer. In sub-step 209, first spaced-apart (e.g., relaxed) semiconductor regions of a first doping type (either N or P) of a first mobility are formed on first portions of the transition layer. In sub-step 210, second spaced-apart (e.g., strained) semiconductor (SC) regions of a second doping type opposite the first doping type and a second higher mobility are formed interleaved with the first spaced-apart regions on second portions of the transition layer. The first and second interleaved SC regions may be formed in either order, that is, the first (e.g., relaxed) SC regions may be formed first and the second (e.g., strained) SC regions may be formed second. This is the sequence illustrated in FIGS. 3-10, but this is not essential. Alternatively, the second (e.g., strained) spaced-apart SC regions may be formed first and the first (e.g., relaxed) spaced-apart SC regions may be formed second, interleaved with the second regions. Either arrangement is useful. This provides superjunction structure 54-10 of FIG. 10. The substrate and transition layer may be removed, thereby providing superjunction structure 81 alone, i.e., without substrate 56 and transition layer 58. In subsequent step 212, electrical contacts are formed on the second (e.g., strained) SC regions adapted to carry current through the second regions in a direction parallel to the first regions. Additional contacts may also be formed on the first (e.g., relaxed) SC regions. As will be understood by persons of skill in the art based on the teachings herein, the nature and arrangement of the contacts will depend upon the particular type of device or devices being fabricated. Following step 212, method 200 proceeds to END 214, wherein conventional post wafer processing may be employed. As mentioned earlier in connection with FIG. 13, it is not necessary that the described regions actually be relaxed or strained provided that they have differing mobilities wherein the higher mobility material occupies the locations of the strained material and the lower mobility material occupies the locations of the relaxed material.

Referring now to FIG. 15, method 300 begins with START 302 and initial PROVIDE A SUBSTRATE step 304, analogous to step 204 of method 200, the details of which are incorporated herein by reference. In step 306, transition layer (abbreviated "TL") 58 is formed on substrate 56, as has been previously described. In step 308, a refractory mask, e.g., mask 60, is formed on transition layer 58 (e.g., in manufacturing stage 52-4 ). In step 310, spaced-apart slots (e.g., slots 66) are cut in mask 60 extending to transition layer 58 (e.g., see manufacturing stage 52-5). In step 312, slots 66 are filled with a first semiconductor (SC) material having a first lattice constant and first conductivity type (either N or P). The first lattice constant may be the same or different than that of the surface of transition layer 58 so that the first SC material may be relaxed or strained. In step 314, the remaining mask material, e.g., portions 60-1, 60-2, 60-3, etc., of mask 60 are removed, thereby forming second slots 69 interleaved with the first SC material 70-1, 70-2, 70-3, 70-4, etc. Steps 312-314 are illustrated in manufacturing stages 52-6 through 52-8. In step 316, second slots 69 are filled with a second semiconductor (SC) material having a second different lattice constant and opposite conductivity type relative to the first SC material, thereby forming SC regions 74 (see manufacturing stages 52-9 and 52-10). In step 318, contacts are formed or provided adapted to be able to conduct current through whichever of the first or second SC materials is strained (or of higher mobility), parallel to the other (relaxed) SC material (see for example, manufacturing stages 52-11, 52-12). Following step 318, method 300 proceeds to END 320, wherein conventional post wafer processing may be carried out.

In accordance with a first embodiment, there is provided a method for forming a semiconductor device embodying a superjunction structure, comprising, in either order, forming first spaced-apart regions of a first semiconductor material having a first conductivity type and a first lattice constant, forming second spaced-apart regions of a second semiconductor material interleaved with the first space-apart regions, and having a second different conductivity type and a second different lattice constant so that the second semiconductor material in the second regions is strained with respect to the first semiconductor material in the first regions and one or more PN junctions exists therebetween, and providing electrodes adapted to carry current through at least part of the strained second semiconductor material of the second regions. In a further embodiment, the method further comprises before the forming steps, providing a substrate of a predetermined lattice constant having a principal surface, and providing on the principal surface a graded semiconductor layer having an inner surface against the principal surface and an outer surface separated from the inner surface adapted to receive the first spaced-apart regions and having a lattice constant at the outer surface that substantially matches the first lattice constant so that the first semiconductor material of the first regions formed on a first part of the outer surface is substantially relaxed. In a still further embodiment, the lattice constant at the outer surface is different from the second lattice constant so that the second material of the second regions formed on a second part of the outer surface is strained. In a yet further embodiment, the first semiconductor material comprises SiGe and the second semiconductor material comprises Si with less than 5% Ge. In a still yet further embodiment, the first semiconductor material comprises Si:Ge ratios in the range of about 60:40 to 95:05. In a yet still further embodiment, the first semiconductor material comprises Si:Ge ratios in the range of about 70:30 to 90:10. In another embodiment, the substrate comprises Si with a principal surface of [100] orientation.

In accordance with a second embodiment, there is provided a method for forming a semiconductor device, comprising, providing a substrate having an outer surface, forming on the outer surface, first spaced-apart semiconductor regions of a first conductivity type and first mobility, forming on the outer surface second semiconductor regions of a second opposite conductivity type and higher second mobility, interleaved with the first spaced-apart semiconductor regions to form a superjunction structure, and providing further electrically conducting regions coupled to the superjunction structure and adapted to control current flow to the second semiconductor regions. In a further embodiment, the second providing step comprises, forming body regions communicating with the superjunction structure, and forming in the body regions, source regions separated from the second semiconductor regions by portions of the body region. In a still further embodiment, the method further comprises providing a gate dielectric and gate overlying the portion of the body regions and adapted in response to an electrical signal to create channel regions therein extending from the source regions to the second semiconductor regions. In a yet further embodiment, the first semiconductor region comprises SiGe and the second semiconductor region comprises silicon with less than 5% Ge. In a still yet further embodiment, the first semiconductor region comprises Si:Ge ratios in the range of about 70:30 to about 90:10.

In a third embodiment, there is provided a semiconductor device, comprising, interleaved regions of first and second semiconductor materials of, respectively, first and second conductivity types and first and second mobilities, wherein the second conductivity type is opposite the first conductivity type and the second mobility exceeds the first mobility for a first carrier type, wherein the first and second semiconductor materials are separated by substantially parallel PN junctions and form a superjunction structure, and electrical contacts coupled to the first and second materials so that in response to applied signals, a principal current of the first carrier type flows through the second material. In a further embodiment, the first semiconductor material is a relaxed semiconductor material and the second semiconductor material is a strained semiconductor material. In a still further embodiment, the first semiconductor material has a different lattice constant than the second semiconductor material. In a yet further embodiment, the first semiconductor material comprises SiGe and the second semiconductor material comprises silicon with less than 5%. In a yet still further embodiment, the first semiconductor material comprises SiGe having a Si:Ge ratio in the range of about 60:40 to 95:05. In a still yet further embodiment, the first semiconductor material comprises SiGe having a Si:Ge ratio in the range of about 80:20 to 85:15. In another embodiment, the first semiconductor material is P-type and the second semiconductor material is N-Type and the principal current comprises electrons. In a still another embodiment, the device further comprises a body region of the first conductivity type communicating with the first and second semiconductor materials, one or more source regions of the second conductivity type located in the body region and separated from the second semiconductor material by a portion of the body region, and an insulated gate located over the portion of the body region and adapted in response to an electrical signal to control a conductive channel through the body region between the one or more source regions and the second semiconductor material.

While at least one exemplary embodiment has been presented in the foregoing detailed description, it should be appreciated that a vast number of variations exist, especially with respect to choices of device types and materials. The above-described invention is especially useful for formation of TMOS devices, but persons of skill in the art will understand based on the description herein that other types of devices can also be fabricated using the principles described herein. For example, and not intended to be limiting, the present invention is useful for fabrication of Diode, BJT, IGBT and Thyristor devices as well as those described herein. Further, while Si and SiGe are provided as examples of suitable materials for use in combination to produce the adjacent relaxed and strained semiconductor regions described herein, this is merely by way of example and not intended to be limiting. The following is a non-limiting list of other suitable semiconductor materials that can be used in combination to achieve analogous relaxed and strained regions in a superjunction configuration, specifically: GaN and Si, InGaN and GaN, InAsP and InP, SiC and AlN, SiC and BP, SiGe and GaAs, GaAs and Ge, Si and $Si_{1-y}C_y$ and so forth. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a semiconductor device embodying a superjunction structure, comprising:
in either order;
forming first spaced-apart regions of a first semiconductor material having a first conductivity type and a first lattice constant;
forming second spaced-apart regions of a second semiconductor material interleaved with the first space-apart regions, and having a second different conductivity type and a second different lattice constant so that the second semiconductor material in the second regions is strained with respect to the first semiconductor material in the first regions and one or more PN junctions exists therebetween; and
providing electrodes adapted to carry current through at least part of the strained second semiconductor material of the second regions.

2. The method of claim 1, further comprising before the forming steps:
providing a substrate of a predetermined lattice constant having a principal surface; and
providing on the principal surface a graded semiconductor layer having an inner surface against the principal surface and an outer surface separated from the inner surface adapted to receive the first spaced-apart regions and having a lattice constant at the outer surface that substantially matches the first lattice constant so that the first semiconductor material of the first regions formed on a first part of the outer surface is substantially relaxed.

3. The method of claim 2, wherein the lattice constant at the outer surface is different from the second lattice constant so that the second material of the second regions formed on a second part of the outer surface is strained.

4. The method of claim 1, wherein the first semiconductor material comprises SiGe and the second semiconductor material comprises Si with less than 5% Ge.

5. The method of claim 4, wherein the first semiconductor material comprises Si:Ge ratios in the range of about 60:40 to 95:05.

6. The method of claim 5, wherein the first semiconductor material comprises Si:Ge ratios in the range of about 70:30 to 90:10.

7. The method of claim 2, wherein the substrate comprises Si with a principal surface of [100] orientation.

8. A method for forming a semiconductor device, comprising:
providing a substrate having an outer surface;
forming on the outer surface, first spaced-apart semiconductor regions of a first semiconductor material having a first conductivity type and first mobility;
forming on the outer surface second semiconductor regions of a second semiconductor material having a second opposite conductivity type and higher second mobility, interleaved with the first spaced-apart semiconductor regions to form a superjunction structure in which one or more PN junctions exist between the first spaced-apart semiconductor regions and the second semiconductor regions, and wherein the second semiconductor material in the second semiconductor regions is strained with respect to the first semiconductor material in the first spaced-apart semiconductor regions; and
providing further electrically conducting regions coupled to the superjunction structure and adapted to control current flow to the second semiconductor regions.

9. The method of claim 8, wherein the second providing step comprises:

forming body regions communicating with the superjunction structure; and forming in the body regions, source regions separated from the second semiconductor regions by portions of the body region.

10. The method of claim 9, further comprising, providing a gate dielectric and gate overlying the portion of the body regions and adapted in response to an electrical signal to create channel regions therein extending from the source regions to the second semiconductor regions.

11. The method of claim 8, wherein the first semiconductor region comprises SiGe and the second semiconductor region comprises silicon with less than 5% Ge.

12. The method of claim 11, wherein the first semiconductor region comprises Si:Ge ratios in the range of about 70:30 to about 90:10.

13. A method for forming a semiconductor device embodying a superjunction structure, comprising:

providing a substrate having a principal surface;

forming a semiconductor transition layer having an outer surface and an inner surface at the principal surface of the substrate;

forming first spaced-apart regions of a first semiconductor material having a first conductivity type and a first lattice constant on first parts of the outer surface of the semiconductor transition layer; and forming second spaced-apart regions of a second semiconductor material on second parts of the outer surface of the semiconductor transition layer and interleaved with the first space-apart regions to produce one or more PN junctions between the first spaced-apart regions and the second spaced-apart regions, wherein the second semiconductor material has a second different conductivity type and a second lattice constant that is different from the first lattice constant, and wherein one of the first semiconductor material or the second semiconductor material is strained with respect to the other of the first semiconductor material or the second semiconductor material.

14. The method of claim 13, wherein the substrate has a first lattice constant, and wherein forming the semiconductor transition layer comprises:

providing on the principal surface the semiconductor transition layer as a graded semiconductor layer having the inner surface against the principal surface and the outer surface separated from the inner surface and adapted to receive the first spaced-apart regions and having a lattice constant at the outer surface that substantially matches the first lattice constant so that the first semiconductor material of the first regions formed on the first parts of the outer surface is substantially relaxed.

15. The method of claim 14, wherein the lattice constant at the outer surface is different from the second lattice constant so that the second material of the second regions formed on a second part of the outer surface is strained.

16. The method of claim 13, wherein forming the first spaced-apart regions comprises:

forming a refractory mask layer over the outer surface of the semiconductor transition layer;

removing first portions of the refractory mask layer to form first spaced-apart slots extending from a surface of the refractory mask layer to the first parts of the outer surface of the semiconductor transition layer; and filling the first spaced-apart slots with the first semiconductor material.

17. The method of claim 16, wherein forming the second spaced-apart regions comprises:

removing remaining portions of the refractory mask layer to form second spaced-apart slots extending to the second parts of the outer surface of the semiconductor transition layer; and filling the second spaced-apart slots with the second semiconductor material.

18. The method of claim 13, further comprising:

providing electrodes adapted to carry current through whichever of the first semiconductor material or the second semiconductor material is substantially relaxed with respect to the other of the first semiconductor material or the second semiconductor material.

19. The method of claim 13, wherein the first spaced-apart regions interleaved with the second spaced-apart regions together form a superjunction structure, and the method further comprises:

providing further electrically conducting regions coupled to the superjunction structure and adapted to control current flow to the second semiconductor regions by forming body regions communicating with the superjunction structure, and forming in the body regions, source regions separated from the second spaced-apart regions by portions of the body regions.

20. The method of claim 19, further comprising:

providing a gate dielectric and gate overlying the portions of the body regions and adapted in response to an electrical signal to create channel regions in the body regions extending from the source regions to the second spaced-apart regions.

* * * * *